United States Patent [19]

Mizutani

[11] Patent Number: 4,661,833

[45] Date of Patent: Apr. 28, 1987

[54] ELECTRICALLY ERASABLE AND PROGRAMMABLE READ ONLY MEMORY

[75] Inventor: Yoshihisa Mizutani, Tokyo, Japan

[73] Assignee: Kabushiki Kaisha Toshiba, Kawasaki, Japan

[21] Appl. No.: 792,562

[22] Filed: Oct. 29, 1985

[30] Foreign Application Priority Data

Oct. 30, 1984 [JP] Japan .................................. 59-228521

[51] Int. Cl.[4] .................... H01L 29/78; H01L 29/06; H01L 29/34; H01L 27/02
[52] U.S. Cl. ........................................ 357/54; 357/20; 357/23.5; 357/23.13; 357/41; 357/86; 365/185
[58] Field of Search ................. 357/23.5, 23.13, 41, 357/20, 86, 54; 365/185

[56] References Cited

U.S. PATENT DOCUMENTS

| | | | |
|---|---|---|---|
| 4,132,904 | 1/1979 | Harari | 357/23.5 |
| 4,228,527 | 10/1980 | Gerber et al. | 365/185 |
| 4,379,343 | 4/1983 | Moyer | 357/23.5 |
| 4,471,373 | 9/1984 | Shimizu et al. | 357/23.5 |
| 4,532,535 | 7/1985 | Gerber et al. | 357/23.5 |

OTHER PUBLICATIONS

Iizuka et al., "Stacked-Gate Avalanche-Injection Type MOS (SAMOS) Memory," Proceedings of the 4th Conf. on Solid State Devices, Tokyo, 1972, *Supplement to the Journal of Japan Society of Applied Physics*, vol. 42, (1973), pp. 158–166.

Nissan-Cohen et al., "High Field Current Induced-Positive Charge Transients in $SiO_2$", *J. Appl. Phys.*, vol. 54, pp. 5793–5800 (1983).

*Primary Examiner*—J. Carroll
*Attorney, Agent, or Firm*—Finnegan, Henderson, Farabow, Garrett & Dunner

[57] ABSTRACT

An electrically erasable and programmable read only memory comprises a semiconductor substrate of a first conductivity type, source and drain regions both of a second conductivity type formed in the surface of said semiconductor substrate, a gate insulation film formed on that section of the surface of said substrate which includes a channel region defined between said source and drain regions, a first diffusion region of the second conductivity type, part of which is formed in said substrate and contacts said drain region and which has a lower impurity concentration than said drain region, a first insulation film formed on said first diffusion region, a floating gate formed on said gate insulation film, part of which extends over said first insulation film, a second diffusion region of the first conductivity type formed in the surface of said first diffusion region which lies near said extension of the floating gate, a third diffusion region of the first conductivity type formed in the surface of said first diffusion region, a second insulation film covering said floating gate, and a control gate crossing at least that section of the surface of said second insulation layer which faces part of said floating gate.

6 Claims, 14 Drawing Figures

ELECTRICALLY ERASABLE AND PROGRAMMABLE READ ONLY MEMORY

BACKGROUND OF THE INVENTION

This invention relates to an electrically erasable and programmable read only memory (abbreviated as "EEPROM"), and more particularly to the EEPROM designed to perform writing and erasure at different sections.

FIG. 1 shows the arrangement of the conventional EEPROM cell. Reference numeral 1 represents a p type single crystal silicon substrate. A field oxide film 2 is selectively formed on the surface of the substrate 1. The island regions of the substrate 1 are separated from each other by the field oxide film 2. Electrically isolated n+type source region 3 and drain region 4 are formed on these island regions. A gate oxide film 5 is formed on that portion of the substrate 1 which includes a channel region lying between the source and drain regions 3, 4. A floating gate 6 is set on the gate oxide film 5. An insulation film 7 is formed on the floating gate 6. A control gate 8 is laid on the insulation film 7. A portion of the control gate 8 lies over the field oxide film 2. An insulating film 9 covers the surface of the structure including the control gate 8. A source electrode 10 and drain electrode 11 formed on the insulation film 9. The electrodes 10 and 11 extend through contact holes (refer to Section A of FIG. 1) and contact the source and drain regions. An n+type diffusion region 4', an extension of the drain region 4, is provided on the surface of the substrate 1 adjacent to the island. A thin insulation film 12 is formed on the diffusion region 4'. An extension 6' of the floating gate 6 is provided on the thin insulation film 12. The n+type diffusion region 4', thin insulation film 12 and the extension 6' of the floating gate 6 jointly constitute an MOS capacitor B (FIG. 1).

When, with the EEPROM cell described above, a high voltage, for example 20 volts, is applied between the drain electrode 11 and control gate 8, tunnel current flows between the extension 6' of the floating gate 6 and n+type diffusion region 4' through the thin insulation film 12, whereby the floating gate 6 is charged or discharged. The EEPROM cell stores data "0" when the floating gate 6 is charged. It stores data "1" when the floating gate 6 is not charged. The threshold voltage $V_{TH}$ of the transistor A (FIG. 1) represents high when the floating gate 6 is charged, and low when the gate 6 is not charged.

However, with the floating gate 6 repeatedly charged and discharged to alter the stored information, using a constant voltage impressed between the drain electrode 11 and control gate 8, the resultant threshold voltage of the transistor A (FIG. 1) will vary little by little. More specifically, as shown in FIG. 2, with the floating gate repeatedly charged and discharged, the width of threshold voltage change of the transistor A is somewhat enlarged in early several cycles and then it is relatively constant for a while, and it begins to reduce, finally failing to distinguish data "0" from data "1". This event is explained by the following reasons.

When the floating gate 6 is charged or discharged as the tunnel current flows through the thin insulation film 12, an intense electric field of 8 to 10 MV/cm is applied on the film 12, and positive electric charge is trapped in the film 12. Since not so many such trapsites exist within the film 12, they are soon saturated. The positive charge undergoes substantially no change. The tunnel current inevitably flows with greater ease by positive charge trapped in the thin insulation film 12, leading to noticeable changes in the threshold voltage.

While the tunnel current is flowing through the thin insulation film 12, electrons are also trapped in the thin insulation film 12. They are not so rapidly trapped as positive charge, but they are trapped steadily and exceed the quantities of positive charge stored in the thin insulation film 12 sometime later. As a result, the tunnel current flows with greater difficulty, thereby reducing the rate of variations in the threshold voltage. The intense electric field applied on the film 12 increases the electron-trapping sites in the film 12. Consequently, negative charge stored in the thin insulation film 12 is not saturated. The threshold voltage changes at a steadily decreasing rate. In some cases, dielectric breakdown occurs caused by the internal electric field generated by the electric charge stored in the thin insulation film 12.

The present inventor's experiment shows that the minimum intensity of electric field to generate electron trap sites in the film 12 ranges between 4.5 and 5 MV/cm. However, such a low electric field does not substantially give rise to the flow of tunnel current, thereby failing to cause electric charge to be introduced into or drawn out from the floating gate.

SUMMARY OF THE INVENTION

It is accordingly the object of this invention to provide an EEPROM wherein a floating gate can be effectively charged or discharged by means of the hotcarriers generated in a semiconductor substrate.

To attain the above-mentioned object, this invention provides EEPROM which comprises:

a semiconductor substrate of the first conductivity type;

source and drain regions both of the second conductivity type formed in the surface of the substrate;

a gate insulation film formed on that section of the substrate which includes a channel region extending between the source and drain regions;

a first diffusion region of the second conductivity type which is formed in the substrate surface with part set adjacent to the drain region, and has a lower impurity concentration than the drain region;

a first insulation film formed on the first diffusion region;

a floating gate formed on the gate insulation film with a part extending on the first insulation film;

a second diffusion region of the first conductivity type which is formed in the surface of the first diffusion region and is set close to the extension of the floating gate;

a third diffusion region of the first conductivity type formed in the surface of the first diffusion region;

a second insulation film covering the floating gate; and a control gate crossing at least that part of the surface of the second insulation film which faces part of the floating gate.

DETAILED DESCRIPTION OF THE PREFERRED EMBODIMENTS

Description may now be made with reference to FIGS. 3A to 3J of the sequential steps of manufacturing the memory cell of EEPROM according to a first embodiment of this invention.

Figure 1:
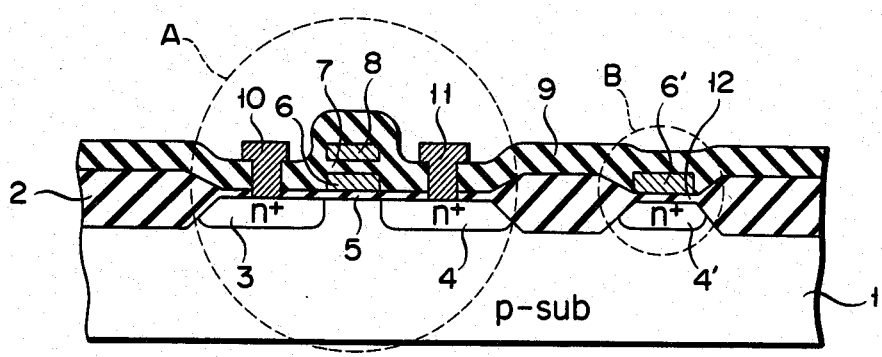
FIG. 1 is a sectional view of the memory cell of the conventional EEPROM.
Figure 2:
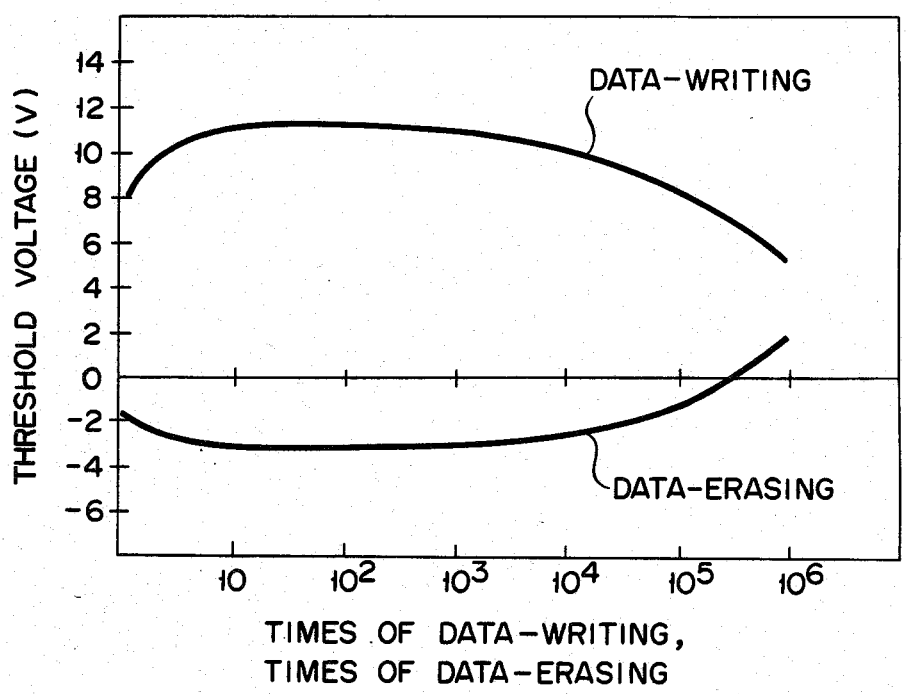
FIG. 2 is a curve diagram showing the range of variations in the threshold voltage detected in the transistor provided in Section A of FIG. 1 when data rewriting is repeatedly carried out on the memory cell of the conventional EEPROM.
Figure 3A:
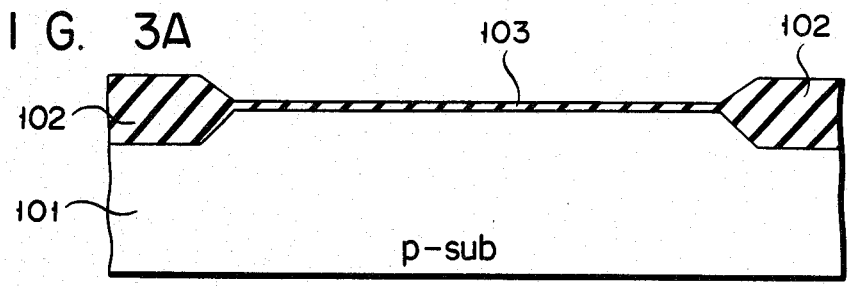
FIGS. 3A to 3J are sectional views showing the sequential steps of manufacturing the memory cell of EEPROM according to a first embodiment of this invention.
Figure 3B:
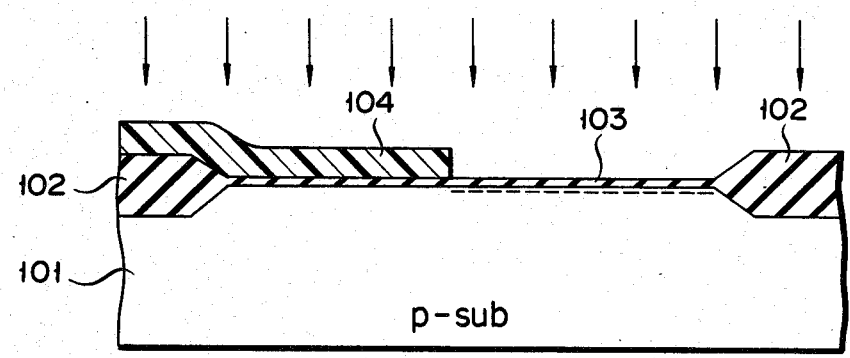
Figure 3C:
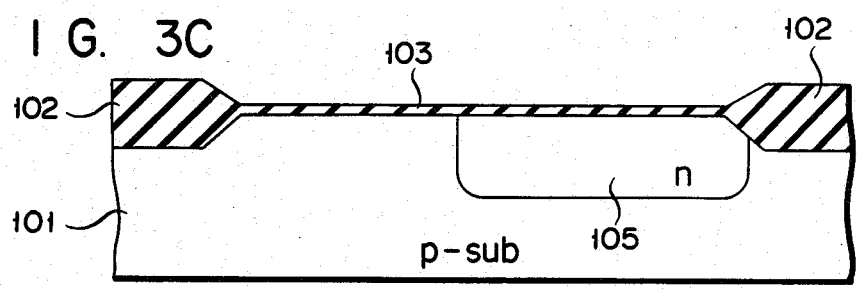
Figure 3D:
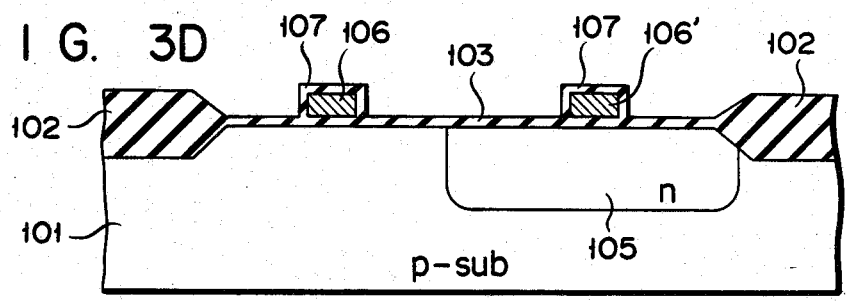

First, as shown in FIG. 3A, a p type silicon substrate 101 was selectively oxidized forming a field oxide film 102 and thus dividing the silicon substrate 101 into island regions. Thermal oxidation was applied in dry oxygen atmosphere at 900° to 1,000° C., forming an oxide film 103 with a thickness of 300 Å on the surface of the island regions. The oxide film 103 was used as a gate oxide film and first insulation film. As shown in FIG. 3B, a resist pattern 104 was formed by photoetching method on part of the surface of the oxide film 103 and also on the surface of the field oxide layer 102. Ions of phosphorus were implanted in the substrate 101 under the accelerated voltage of 150 keV and the dosage of $2 \times 10^{13}$ cm$^{-2}$, using the resist pattern 104 as a mask. The resist pattern 104 was removed as illustrated in FIG. 3C. Annealing was undertaken for about 4 hours at a temperature of 1,100° to 1,200° C., thereby activating the ion-implanted phosphorus and forming an n-well region 105 having a depth of 3 microns (that is, a first diffusion region). As shown in FIG. 3D, a phosphorus-doped polycrystalline silicon film having a thickness of 3,000 Å was deposited by the LPCVD process on the whole surface of the substrate 101. A floating gate 106 was formed by patterning the polycrystalline silicon film. The floating gate 106 has an extension 106' which lies on the oxide film 103 and makes a U-turn on the surface of the field oxide film 102, reaching that portion of the oxide film 103 which is formed on the n-well region 105. Thereafter, thermal oxidation was applied in an oxydizing atmosphere at a temperature of 900° to 1,000° C., thereby forming an oxide film (a second insulation film) 107 with a thickness of 600 Å on the surface of the floating gate 106 including the aforementioned extension 106'.

Figure 3E:
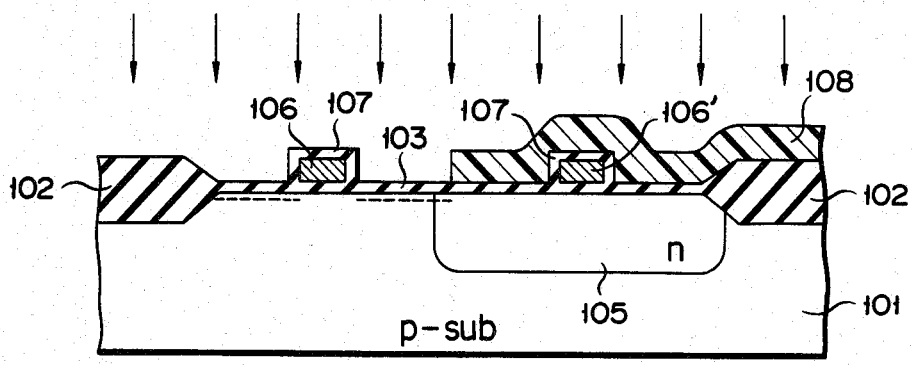
Figure 3F:
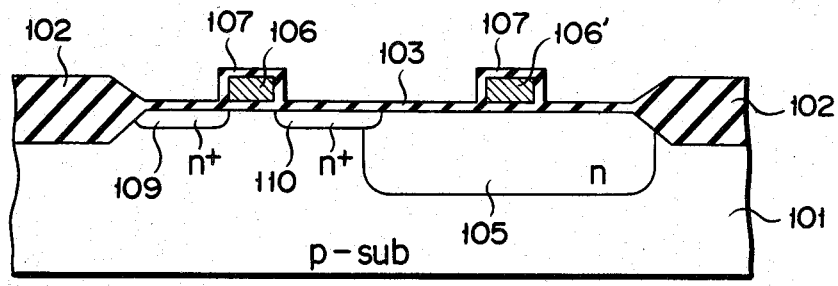

As shown in FIG. 3E, a resist pattern 108 was formed by photoetching method. Then an n type impurity, for example arsenic, was ion-implanted into the island region of the substrate including part of the n-well region 105 under the accelerated voltage 50 keV and the dosage of $1 \times 10^{15}$ cm$^{-2}$, using resist pattern 108, the floating gate 106 and field oxide film 102 as masks. Subsequently as shown in FIG. 3F, the resist pattern 108 was removed, and annealing was undertaken to activate the ion-implanted arsenic, thus providing isolated n+type source region 109 and drain region 110. At this time, a drain region 110 was formed which contacts the n-well region 105.

Figure 3G:
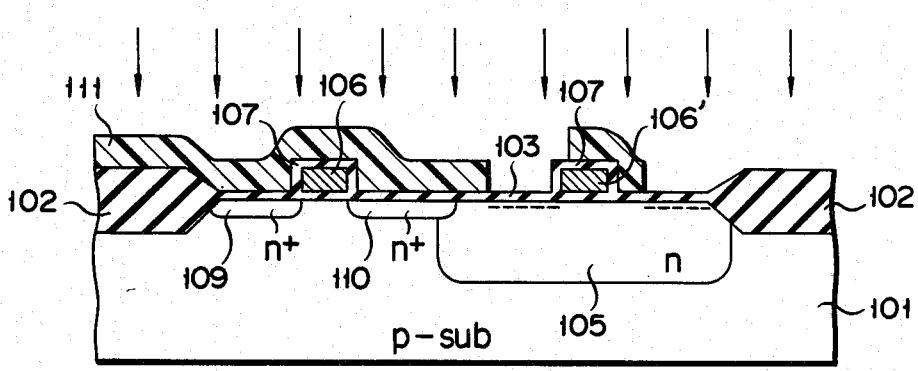
Figure 3H:
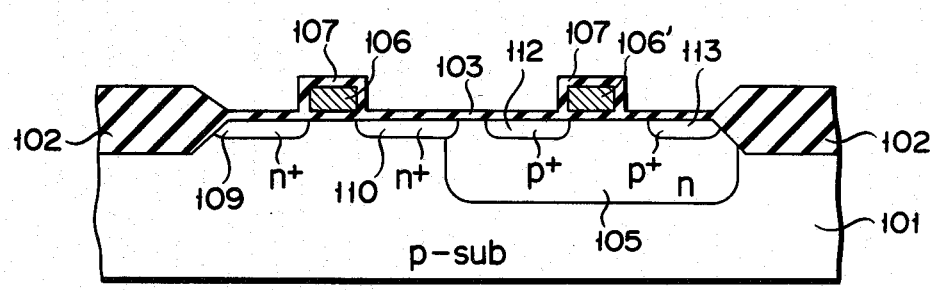

As indicated in FIG. 3G, a resist pattern 111 was formed by photoetching method. A p type impurity, for example boron, was introduced into the n-well region 105 under the accelerated voltage 50 keV and dosage of $1 \times 10^{15}$ cm$^{-2}$, using the resist pattern 111, extension 106' and field oxide film 102 as masks. As shown in FIG. 3H, the resist pattern 111 was removed. Annealing was carried out to activate the ion implanted boron, thereby providing a first p+type diffusion region (a second diffusion region) 112 and a second p+type diffusion region (a third diffusion region) 113 on the surface of the n-well region 105. The first p+type diffusion region 112 was formed in that portion of the surface of the n-well region 105 positioned near the extension 106'. The second p+type diffusion region 113 was formed in that portion of the surface of the n-well region 105 which was set apart from the extension 106'.

Figure 3I:
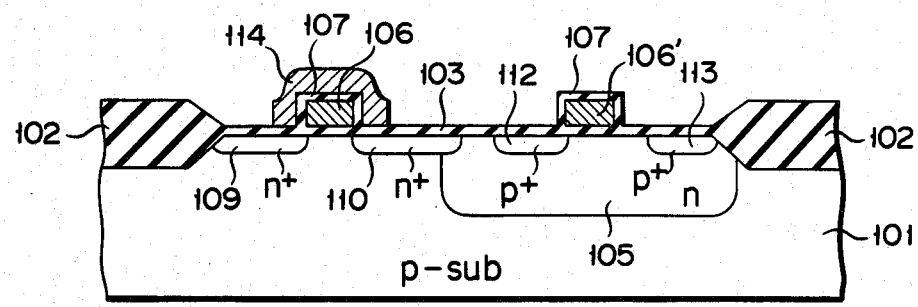

As shown in FIG. 3I, a phosphorus-doped polycrystalline silicon film having a thickness of 3,500 Å was deposited by the LPCVD process on the whole surface of the superposed pass. A control gate 114 was then formed, on the oxide film 107, by patterning the polycrystalline silicon film, surrounding the surface of the floating gate 106. The ends of the control gate 114 contact on the field oxide film 102.

Figure 3J:
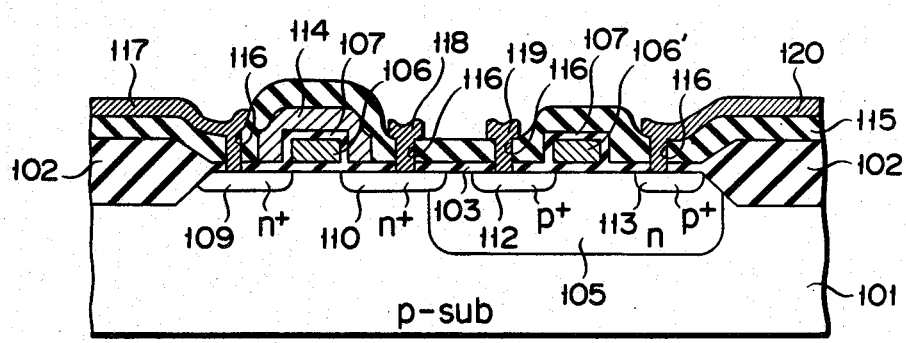
Figure 4:
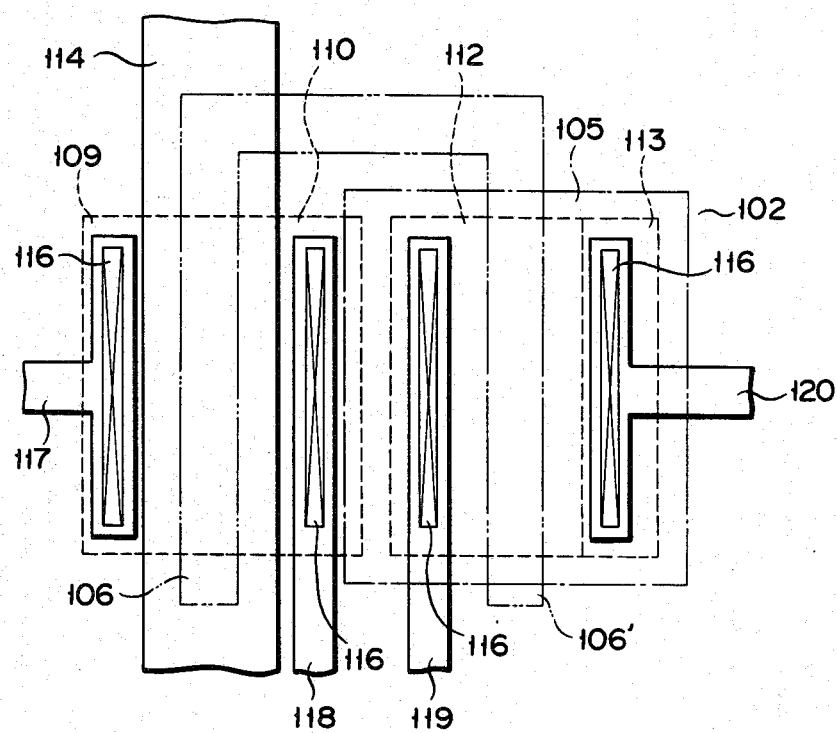
FIG. 4 is a plan view of the memory cell of FIG. 3J.

As shown in FIGS. 3J and 4, an SiO$_2$ film 115 was deposited by the CVD process on the whose surface of the structure. Contact holes 116 were cut in the films 115 and 103. An aluminium film was deposited by sputtering on the SiO$_2$ film 115 and then patterned, thus providing source and drain electrodes 117, 118 and first and second electrodes 119, 120. Thus, the EEPROM cell was finally manufactured. The source electrode 117 extended through the contact hole 116 and was connected to the source region 109, and the drain electrode 118 extended through the contact hole 116 and was connected to the drain region 110. The first electrode 119 extended through the hole 116, contacting the first p+type diffusion region 112. The second electrode 120 extends through the hole 116, contacting the second p+type diffusion region 113. The electrodes 117 and 120 were connected together. The source region 109 and second p+type diffusion region 113, connected to each other, had the same potential. The control gate 114 and first electrode 119 were connected together. The control gate 114 and the first p+type diffusion region 112 connected to the electrode 119 had the same potential.

The EEPROM cell of this invention is constructed as shown in FIGS. 3J and 4. The n+type source and drain regions 109, 110 are formed in the surfaces of the island regions of the p type silicon substrate 101. The oxide film 103, functioning as a gate oxide film, is covered on that portion of the substrate 101 including a channel region defined between the source and drain regions 109, 110. The n-well region 105 (i.e., a first diffusion region), having a lower impurity concentration than the drain region 110, is formed in the surface of the island region of the substrate 101 in such a manner that part of the n-well region 105 contacts the drain region 110. The oxide film 103, acting as a first insulation film, is covered on the n-well region 105. The floating gate 106 is laid on that portion of the oxide film 103 which faces the channel region. The floating gate 106 has an extension 106' which extends over the oxide film 103 facing the n-well region 105. The first p+type diffusion region 112 (i.e., a second diffusion region) is formed in that surface portion of the n-well region 105 which lies near the extension 106'. The second p+type diffusion region 113 (i.e., a third diffusion region) is formed in that surface portion of the n-well region 105 which is opposite to the first p+type diffusion region 112 across the extension 106'. The second p+type diffusion region 113 is set apart from the extension 106'. The source region 109 is connected to the source electrode 117. The drain region 110 is connected to the drain electrode 118. The first p+type diffusion region 112 is connected to the first electrode 119. The second p+type diffusion region 113 is connected to the second electrode 120. The source region 109 and second p+type diffusion region 113 are so connected as to have the same potential. Similarly, the control gate 114 and first p+type diffusion region 112 are so connected as to have the same potential.

Description may now be made of the operation of EEPROM cell (FIGS. 3J and 4). When electrons (negative charge) move into the floating gate 106, a positive voltage (for example, about +10 volts) is applied on the control gate 114 and drain electrode 118, relative to the source electrode 117. As a result, a transistor consisting of the floating gate 106 and n+type source and drain regions 109, 110 is rendered conducting, causing electrons to flow from the source region 109 to the drain region 110. An electric field is concentrated in the proximity of the drain region 110. Hotelectrons are generated in the region 110 due to impact ionization, and some portion of these hotelectrons injected into the floating gate 106. At this time, current is shut off in the region lying between the drain electrode 118 and second electrode 120, by the pn junction formed between the n-well region 105 and the p+type diffusion region 113 connected to the second electrode 120, and held in the reverse bias condition.

For injection of holes (positive charge) into the floating gate 106, a negative potential of about −5 V is applied on the control gate 114, relative to the drain electrode 118. As a result, the p+type diffusion region 112 formed near the extension 106' of the floating gate 106 is held in a reverse bias condition, relative to the n-well region 105 contacting the n+type drain region 110. This condition results from the pn junction formed between the p+type diffusion region 112 and the n-well region 110. Consequently, a depletion layer is formed in an area extending from the p+type diffusion region 112 to the underside of the extension 106'. When, under the above-mentioned condition, a positive voltage (for example, about +1 to 2 volts) slightly higher than that of the drain electrode 118 is impressed on the source electrode 117, then voltage is applied in the forward direction on the pn junction formed between the n-well region 105 and the second p+type diffusion region 113. Some of the holes, that flow the n-well region 105, move to the depletion layer formed under the extension 106' of the floating gate 106. The holes are accelerated by the electric field generated in the depletion layer, and go over a barrier height (~3.8 eV) built between the silicon substrate 101 and the oxide film 103 into the extension 106', (the floating gate 106). The holes neutralize electrons in the floating gate 106, electrically expeling electrons from the floating gate 106. When other holes continuously inject into the floating gate 106, the gate 106 is positively charged, thereby enabling the threshold voltage of the transistor section to vary at a higher rate.

To read the stored data from the EEPROM cell, a low positive voltage (e.g., about +3 Volts) is applied on the control gate 114 and drain electrode 118, and the threshold voltage of the aforementioned transistor is detected, whereby the data is read out. Current may be shut off from the area lying between the drain electrode 118 and second electrode 120, due to the the pn junction formed between the n-well region 105 and the p+type diffusion region 113 contacting the second electrode 120 and held in the reverse bias condition. In this case, the data is prevented from being read out by mistake.

To charge or discharge the floating gate 106 the hotcarriers generated in the silicon substrate 101 and n-well region 105 may be used. In other words, the floating gate 106 can be charged by hotelectrons generated by the impact ionization occurring near the drain region 110 of a transistor consisting of the floating gate 106, n+type source and drain regions 109, 110. The floating gate 106 can be discharged by the holes carried from the second p+type diffusion region 113 into the n-well region 105 and accelerated by the electric field of a depletion layer lying under the extension 106' of the floating gate 106, from the first p+type diffusion region 112. Therefore, the EEPROM of this invention has an entirely different arrangement from that of the conventional device wherein the floating gate is charged and discharged by means of tunnel current. Namely, in the EEPROM of the invention a high electric field is never applied on the oxide film 103 formed on the underside of the floating gate 106. In the case of the present invention, an electric field impressed on the oxide film 103 has a potential of 1 to 2 MV/cm at most. As previously described, therefore, such a weak electric field does not generate any electron trapping sites in the oxide film 103. Consequently, the oxide film 103 lying under the floating gate 106 does not undergo dielectric breakdown, but enables the data stored in the memory cell to be rewritten more frequently.

In the foregoing embodiment, the first p+type diffusion region 112 (i.e., a second diffusion region) is formed in that portion of the surface of the n-well region 105 (i.e., a first diffusion region) which contacts the n+type drain region 110 and lies near the extension 106' of the floating gate 106. The second p+type diffusion layer 113 (i.e., a third diffusion region) is formed in that portion of the surface of the n-well region 105 which faces the first p+type diffusion region 112 across the extension 106'. However, no limitation is imposed on the above-mentioned arrangement. For instance, the second p+type diffusion region 113 and the first p+type diffusion region 112 may be formed in the surface of the n-well region 105, side by side in the lengthwise direction of the extension 106'. When, however, the holes introduced into the n-well region 105 from the second p+type diffusion region 113 are brought into the extension 106' by the electric field generated in the depletion layer extending from the first p+type diffusion region 112 to the underside of the extension 106', it is most preferred that the first and second p+type diffusion regions 112, 113 be so set as shown in FIGS. 3J and 4.

Figure 5:
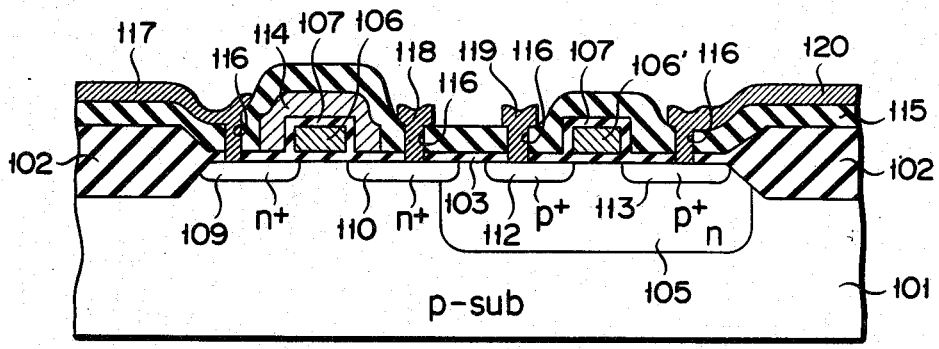
FIG. 5 is a sectional view of the memory cell of EEPROM according to a second embodiment of the invention.

In the foregoing embodiment, the second p+type diffusion region 113 was formed in that portion of the surface of the n-well region 105 which was set apart from the extension 106' of the floating gate 106. However, this arrangement need not be exclusive. For example, as shown in FIG. 5, the second p+type diffusion region 113 may be formed in the surface of the n-well region 105, near the extension 106' of the floating gate 106. When the surface of the n-well region 105 underlying the extension 106' of the floating gate 106 is inverted (i.e. that portion has its polarity reversed) however, the holes move from the second p+type diffusion region 113 flow into the first p+type diffusion region 112 through the inversion layer. Thus, the introduction of holes into the extension 106' is likely to be obstructed. To provide the construction indicated in FIG. 5 is to be provided, it is preferred that a high concentration of impurity be diffused in that portion of the surface of the n-well region 105 underlying the extension 106' of the floating gate 106 in order to suppress the formation of the inversion layer.

In the foregoing embodiment, the source electrode 117 and second electrode 120 were connected together, and the control gate 114 and first electrode 119 were connected together. However, the control gate 114, electrodes 117 to 120 may be separately impressed with voltage.

As mentioned above, the present invention has various advantages. First the floating gate can be effectively charged and discharged by hotcarriers generated in the semiconductor substrate. Secondly, the oxide film underlying the floating gate is free from dielectric breakdown since a weak electric field is applied on it. Thirdly, it is possible to provide EEPROM in which information can be rewritten with a higher frequency.

What is claimed is:

1. An electrically erasable and programmable read only memory which comprises:
   a semiconductor substrate of a first conductivity type;
   source and drain regions both of a second conductivity type separately formed in the surface of said substrate;
   a gate insulation film formed on that portion of the surface of said substrate which includes a channel region defined between said source and drain regions;
   a first diffusion region of the second conductivity type, part of which is formed in said substrate surface in contact with said drain region and which has a lower impurity concentration than said drain region;
   a first insulation film formed on said first diffusion region;
   a floating gate having an extension which extends over said first insulation film;
   a second diffusion region of the first conductivity type which is formed in said first diffusion region lying near the extension of said floating gate;
   a third diffusion region of the first conductivity type which is formed in said first diffusion region;
   a second insulation film covering said floating gate; and
   a control gate crossing at least that section of the surface of said second insulation layer which faces part of said floating gate.

2. The memory according to claim 1, wherein said third diffusion region is formed in that surface portion of said first difussion region which is spaced apart from the extension of said floating gate in horizontal direction.

3. The memory according to claim 1, wherein said third diffusion region is formed in that portion of the surface of said first diffusion region which is set opposite to said second diffusion region across the extension of said floating gate.

4. The memory according to claim 1, wherein said second diffusion region is formed in said first diffusion region which lies near the extension of said floating gate on that side thereof which is set adjacent to said drain region; and said third diffusion region is formed in that part of the surface of said first diffusion region which is set opposite to said second diffusion region across said extension of the floating gate.

5. The memory according to claim 1, wherein said source region and third diffusion region are so connected together as to have the same potential.

6. The memory according to claim 1, wherein said control gate and second diffusion region are so connected together as to have the same potential.

* * * * *